United States Patent
Dube et al.

(10) Patent No.: US 9,471,375 B2
(45) Date of Patent: Oct. 18, 2016

(54) RESOURCE BOTTLENECK IDENTIFICATION FOR MULTI-STAGE WORKFLOWS PROCESSING

(71) Applicant: International Business Machines Corporation, Armonk, NY (US)

(72) Inventors: Parijat Dube, Yorktown Heights, NY (US); Xiaoqiao Meng, Yorktown Heights, NY (US); Jian Tan, Wappingers Falls, NY (US); Li Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 230 days.

(21) Appl. No.: 14/134,833

(22) Filed: Dec. 19, 2013

(65) Prior Publication Data

US 2015/0178129 A1 Jun. 25, 2015

(51) Int. Cl.
*G06F 9/48* (2006.01)
*G06F 17/50* (2006.01)

(52) U.S. Cl.
CPC ......... *G06F 9/4881* (2013.01); *G06F 17/5009* (2013.01)

(58) Field of Classification Search
None
See application file for complete search history.

(56) References Cited

U.S. PATENT DOCUMENTS

| | | | | |
|---|---|---|---|---|
| 6,101,460 A * | 8/2000 | Brinkerhoff | ........... | G06Q 10/06 702/176 |
| 7,660,884 B2 * | 2/2010 | Pu | ........................ | G06F 9/5077 709/223 |
| 2005/0071842 A1 * | 3/2005 | Shastry | ................ | G06F 9/5038 718/100 |
| 2006/0106926 A1 | 5/2006 | Kato | | |
| 2008/0010497 A1 | 1/2008 | Kronlund | | |
| 2009/0235268 A1 | 9/2009 | Seidman et al. | | |
| 2009/0249281 A1 | 10/2009 | Fritzsche | | |
| 2009/0300173 A1 * | 12/2009 | Bakman | ................ | G06F 11/008 709/224 |
| 2014/0282425 A1 | 9/2014 | Zhao et al. | | |

OTHER PUBLICATIONS

Dube, P.; Jian Tan; Li Zhang, Identification and approximations for systems with multi-stage workflows, Dec. 11-14, 2011, Simulation Conference (WSC), Proceedings of the 2011 Winter, pp. 3273-3282, ieeexplore.ieee.org/stamp/stamp.jsp?tp=&arnumber=6148024.*
Joyce Nakatumba and Wil M.P. van der Aalst, "Analyzing Resource Behavior Using Process Mining", Business Process Management Workshops, Lecture Notes in Business Information Processing vol. 43, Jan. 2010, pp. 69-80.

(Continued)

*Primary Examiner* — Abdullah Al Kawsar
*Assistant Examiner* — Jorge A Chu Joy-Davila
(74) *Attorney, Agent, or Firm* — Scully, Scott, Murphy & Presser, P.C.

(57) ABSTRACT

Identifying resource bottleneck in multi-stage workflow processing may include identifying dependencies between logical stages and physical resources in a computing system to determine which logical stage involves what set of resources; for each of the identified dependencies, determining a functional relationship between a usage level of a physical resource and concurrency level of a logical stage; estimating consumption of the physical resources by each of the logical stages based on the functional relationship determined for each of the logical stages; and performing a predictive modeling based on the estimated consumption to determine a concurrency level at which said each of the logical stages will become bottleneck.

15 Claims, 4 Drawing Sheets

(56) References Cited

OTHER PUBLICATIONS

Peng Sun et al., "Identifying Performance Bottlenecks in CDNs through TCP-Level Monitoring", W-MUST'11, Aug. 19, 2011, Toronto, Ontario, Canada, Copyright 2011 ACM 978-1-4503-0800—Jul. 11, 2008, pp. 49-54.

Vincent W. Freeh et al., "Analyzing the Energy-Time Tradeoff in High-Performance Computing Applications", IEEE Transactions on Parallel and Distributed Systems archive, vol. 18 Issue 6, Jun. 2007, pp. 835-848.

Gaurav Chandalia and Irina Rish. A companion paper: Blind Source Separation Approach to Performance Diagnosis and Dependency Discovery. IMC'07, Oct. 24-26, 2007, San Diego, California, USA. Copyright 2007 ACM 978-1-59593-908—Jan. 7, 0010 pp. 1-6.

Alina Beygelzimer, Jeff Kephart, Irina Rish. Evaluation of Optimization Methods for Network Bottleneck Diagnosis. Fourth International Conference on Autonomic Computing (ICAC'07), Jun. 11-15, 2007, pp. 20.

Gee, J.D., et al., "Cache Performance of the SPEC92 Benchmark Suite", IEEE Micro, Aug. 1993, pp. 17-27, 13(4).

Martin, M., "CIS 371 Computer Organization and Design", cis.upenn.edu/~milom/cis371-Spring09/, Spring 2009, Printed on Apr. 16, 2016, 6 pages.

Spall, J.C., "An Overview of the Simultaneous Perturbation Method for Efficient Optimization", Johns Hopkins APL Technical Digest, Oct.-Dec. 1998, pp. 482-492, vol. 19, No. 4.

Office Action dated Apr. 22, 2016 received in U.S. Appl. No. 13/937,697, 33 pages.

Office Action dated Apr. 22, 2016 received in U.S. Appl. No. 13/970,180, 36 pages.

\* cited by examiner

RESOURCE BOTTLENECK IDENTIFICATION FOR MULTI-STAGE WORKFLOWS PROCESSING

FIELD

The present application relates generally to computers, and computer applications, information processing, and more particularly to identifying resource bottleneck for multi-stage workflow processing.

BACKGROUND

The increase in scale and complexity of information processing in modern distributed systems has raised many challenging problems. Examples of such distributed processing systems include systems processing complex business process workflows, information/data stream processing systems, management and provisioning systems. Such systems may be expected to handle a large number of processing requests, and hence understanding the scalability issues in systems of this magnitude becomes difficult. While a known methodology makes use of end-to-end measurements in estimating the decomposition of end-to-end delay to different nodes involved in the end-to-end flow, such method is restricted to understanding application level scalability and may only be able to identify bottlenecks at high levels, e.g., at a node level.

BRIEF SUMMARY

A method of identifying resource bottleneck in multi-stage workflow processing, in one aspect, may comprise identifying dependencies between logical stages and physical resources in a computing system to determine which logical stage involves what set of resources. The method may also comprise, for each of the identified dependencies, determining a functional relationship between a usage level of a physical resource and a concurrency level of a logical stage. The method may further comprise estimating consumption of the physical resources by each of the logical stages based on the functional relationship determined for each of the logical stages. The method may also comprise performing a predictive modeling based on the estimated consumption to determine a concurrency level at which said each of the logical stages will become bottleneck.

A system for identifying resource bottleneck in multi-stage workflow processing, in one aspect, may comprise a module operable to execute on a computer processor and further operable to identify dependencies between logical stages and physical resources in a computing system to determine which logical stage involves what set of resources. For each of the identified dependencies, the module may be further operable to determine a functional relationship between a usage level of a physical resource and a concurrency level of a logical stage. The module may be further operable to estimate consumption of the physical resources by each of the logical stages based on the functional relationship determined for each of the logical stages. The module may be further operable to perform a predictive modeling based on the estimated consumption to determine a concurrency level at which said each of the logical stages will become bottleneck.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION

Figure 1:
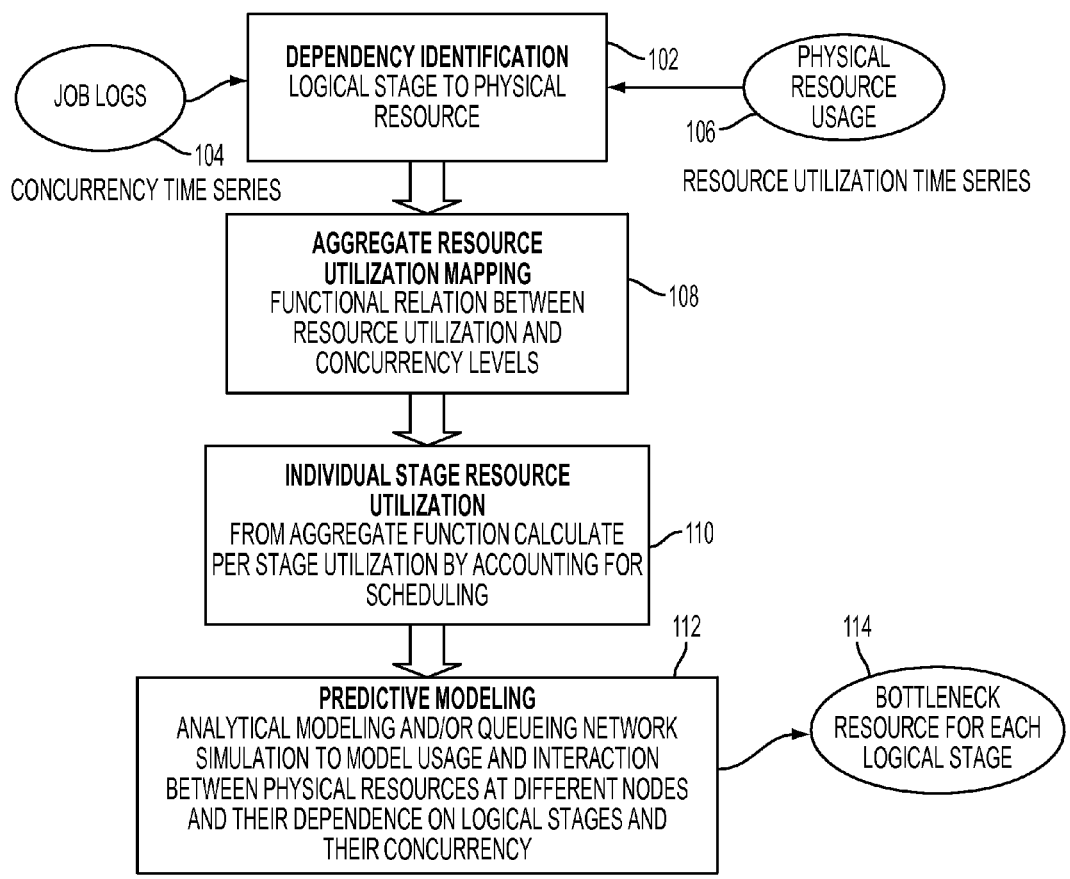
FIG. 1 is a flow diagram illustrating an overview of a method of the present disclosure in one embodiment.

The present disclosure in one aspect may provide an improved method of identifying resource bottlenecks for multi-stage workflows. In one aspect, the present disclosure may provide for mapping workflows to resources at the logical stage level instead of the job level providing for finer granularity and bottleneck determination. For mapping between logical stages and physical resources, the present disclosure may provide for identifying dependencies between workflow and physical resources on a logical stage level, then mapping between resource utilization and concurrency levels of different logical stages, calculating per stage utilization accounting for scheduling, and then modeling the usage and interaction between the logical stages and the physical resources.

The present disclosure, in one aspect, investigates a system that is designed to process many job requests at the same time in a scalable fashion in order to fully utilize all its resources and achieve a high level of throughput. Generally, a job request may need to go through multiple logical processing stages before it is deemed complete. A logical stage can correspond to, for example, a function call in the source code of the application that the job is executing. Each logical processing stage can be handled by one or more nodes in the system. These nodes can be physical computers or virtual machines running on shared physical hardware. Each logical stage of a job consumes one or more different physical resources (central processing unit (CPU), memory, input/output (I/O), disk, and/or others) on one or more nodes. Some of the logical stages can be processed in parallel, while some of the logical stages have to be processed in sequential order. The system is designed to handle many requests at the same time in a scalable fashion in order to fully utilize all its resources and achieve a high level of throughput.

Examples of such distributed processing systems include systems processing complex business process workflows, information/data stream processing systems, management and provisioning systems. A specific example may be the virtual machine provisioning system for the Cloud or the like computing infrastructure. In such a system, the number of processing stages for each request is typically on the order of several hundreds. The system is expected to handle thousands of requests at the same time. The job requests present in the system can be processed in parallel at each logical stage according to a certain level of concurrency level (i.e., the maximum number of jobs that can run in parallel at these stages). Specially, when this concurrency level is equal to one then at these logical stages all the jobs have to be processed in a sequential order. The concurrency limitation can be either explicitly imposed in the software or can occur due to locking on shared resources or can be a result of limited hardware resources.

The present disclosure in one aspect identifies bottleneck resources when the system scalability is limited due to hardware resources. In one aspect, instead of studying system scalability in the context of application throughput, the present disclosure may drill down at scalability of different logical stages in a job.

A step in identifying bottleneck physical resources for a logical stage involves discovering the mapping between the logical stage and the physical resources involved in the execution of that particular stage. Since most of the software design currently involves use of freely available, pluggable component binaries, there is a lack of clear knowledge of all the logical stages involved in an end-to-end flow of a job request. The present disclosure in one aspect identifies the bottleneck at the level of the physical resource (e.g., central processing unit (CPU)/memory/disk) within a node that is the bottleneck. Such bottleneck identification may be useful in identifying software patterns which limit scalability due to the corresponding stress on the physical resources of the system.

In particular, in one aspect, the present disclosure may address the problem of mapping logical stages in a multi-stage workflow to physical resources of the system.

In one aspect, a method is provided in the present disclosure that comprises identifying the physical resources involved in different logical stages of a workflow. Typically a workflow goes through different logical (process-level) stages each of which consume one or more physical resources (CPU, memory, I/O) on one or more nodes. Here, nodes can be physical servers or virtual machines. The nodes and their resources involved in each stage are not explicitly known. Using the resource usage data for different nodes collected using tools like nmon, the method in one embodiment of the present disclosure may identify the resources consumed in a workflow stage and the (potential) bottleneck resource.

In one aspect, the method of the present disclosure may not require any apriori knowledge of network topology or the nodes/resources involved at different stages of a job request. In addition, the method of the present disclosure may identify resource bottleneck at much finer granularity, e.g., at logical stage level as opposed to application level.

FIG. 1 is a flow diagram illustrating an overview of a method of the present disclosure in one embodiment. At 102, mapping from logical stage to physical resources is identified. For each logical stage, the time series of the number of requests (concurrency level) 104 in that stage is obtained (number of requests in a stage over time). Also the usage time series (usage over time) for all the resources 106 in the system (CPU, memory, I/O, disk across all the nodes) is collected, e.g., using nmon utility or the like, which may collect performance statistics of a computer system, e.g., CPU utilization, memory use, kernel statistics, disk I/O rates, and others. From these data, the resources whose usage is correlated with the concurrency level or the change in the concurrency level of the stage are identified. Those resources are potentially consumed in the execution of this stage. This can be done, for example, by calculating the cross-correlation coefficient between the time series of the concurrency level of a logical stage and the resource usage time series. The dependency identification processing at 102 thus determines whether or not a logical stage is correlated to a physical resource. For each node n, a set of logical stages ($S_n$) that execute at that node is obtained.

Apart from looking at each stage in isolation, the method in one embodiment of the present disclosure may also identify correlation between a number of active requests in different stages, for instance, at 108. If the execution of two stages is coupled (unit increase in concurrency level of one results in a unit decrease in concurrency of other and vice-versa) then the method in one embodiment of the present disclosure may couple the two stages into one and analyze the effective concurrency level and resource usage of the coupled stage.

One approach to identify relationship between aggregate utilization of a resource and the concurrency level of a stage at 108 may be to analyze marginal change in resource usage for each unit increase or decrease in the concurrency level of a stage. The marginal change may also be state dependent due to caching and resource sharing among different concurrent threads of the stage. Thus, in this approach, the method of the present disclosure may learn not just the unit change in resource usage but also the functional relationship between usage level of a resource and the concurrency level of a stage. Estimating the first order or second order marginal changes, the method of the present disclosure in one embodiment may construct a first order or second order Taylor's representation of this function.

Another approach at 108 is to use regression function to identify the functional relation between utilization of a physical resource at a node (e.g., CPU) and concurrency level of all the logical stages executing at that node. The utilization is a number between 0 and 1 (with both 0 and 1 inclusive) indicating the fraction of time the resource is being used by the job. Let n=1, . . . , N be the number of physical nodes in the system and s=1, . . . , S be the number of stages in the job. Let $S_n \subseteq S$ be the set of logical stages executing at node n. Let $\{U_{n,t}\}$ be the time series of (observed) aggregate resource utilization at node n and $\{C_{s,n,t}\}$, $s \in S_n$ be the time series of (observed) concurrency level of a stage s which is executed at node n. As an example, let $S_n=\{a,b,c\}$. An example of this data is shown in Table 1.

TABLE 1

| t (time) | $U_{n,t}$ (resource utilization) | s (logical stage) | $C_{s,n,t}$ (concurrency level) |
|---|---|---|---|
| 0 | 0.02 | a | 0 |
|   |      | b | 3 |
|   |      | c | 1 |
| 1 | 0.05 | a | 3 |
|   |      | b | 3 |
|   |      | c | 1 |
| 2 | 0.04 | a | 3 |
|   |      | b | 3 |
|   |      | c | 0 |

In Table 1, at time t=0, there are three instances of logical stage b and 1 instance of logical stage c utilizing a resource, and the utilization for that resource is 0.02. Note, the concurrency level of 0 for logical stage a denotes that this logical stage is not utilizing the resource at time t. Thus for each t, $C_{s,n,t}$, $s \in S_n$, is a vector of concurrency level of different stages that can potentially be executed on the node. Concurrency level of a stage at a given time is the number of jobs that are executing that stage at that time. Using this data, the method in one embodiment of the present disclosure may try to identify the mapping from $\{C_{s,n,t}, s \in S_n\}$ to $\{U_{n,t}\}$. Further if this mapping is not changing with time, we can express this by function $F_n$ such that, $U_n=F_n(C_{s,n}, s \in S_n)$. This will give the utilization on node n for any vector of concurrency level (which is a vector of the number of jobs in different stages at the node) on node n. Different statistical techniques can be applied to learn this relationship including linear/nonlinear regression, machine learning, and others.

In one embodiment of the present disclosure, this mapping is generic and can cover all types of stages ranging from highly processor (e.g., CPU) intensive to highly memory intensive.

After learning the mapping between concurrency-level vector and aggregate utilization of a resource in 108, at 110, the method of the present disclosure in one embodiment can know the processor utilization when only a single instance of a stage is active on the node. Let's call this $U_{n,s,0}$. Observe that $U_{n,s,0}=F_n(C_{s,n}=1, C_{\bar{s},n}=0,$ for all $\bar{s} \in S_n - \{s\})$. Thus $U_{n,s,0}$ is the utilization of node n when there is one job in stage s and no jobs in any other stage which is mapped to node n. Depending on the processor scheduling policy, the method of the present disclosure in one embodiment can calculate the average processor (e.g., CPU) utilization caused by different concurrent stages. For example, under one scheduling policy, called weighted sharing, each instance of stage s on node n gets $U_{n,s,0}$ fraction of processor till the processor is not saturated. When the processor is saturated, the processor cycles allocated to each instance of stage s is in proportion of $U_{n,s,0}$. In one implementation of weighted sharing, when the processor is saturated, each concurrent job in stage s executing on node n gets $$U_{n,s,0} \bigg/ \sum_{s \in S_n} U_{n,s,0} * C_{s,n}$$

fraction of CPU.

At 110, physical resources consumed by each stage in a job request may then be estimated. This step estimates service time of different logical stages. For example, after identifying the candidate resources for each logical stage at 102 and 108, the step at 110 estimates the units of physical resource consumed by single instance of each stage (e.g., by a single job in stage s). Recall that, the number of jobs in stage s is represented as $C_{s,n}$. From the workflow logs, the entry and exit times of each job in different stages can be determined. Let $T_{in,s,i}$ and $T_{out,s,i}$ be the entry and exit time of job i in stage s. Then $R_{s,i}=T_{out,s,i}-T_{in,s,i}$ is the response time of job i in stage s, where the response time of a job in a stage is the amount of time the job spends in that stage. Let $\{U_{n,s,i,t}\}$ be the time series of processor utilization at node n caused by job i when being in stage s. Observe that $U_{n,s,i,t}=0$ for $t<T_{in,s,i}$ and $t>T_{out,s,i}$. Further, under weighted processor sharing:

$$U_{n,s,i,t} = U_{n,s,0} \text{ if } U_{n,t} < 1 \text{ (processor unsaturated), and}$$

$$U_{n,s,i,t} = U_{n,s,0} \bigg/ \sum_{s \in S_n} U_{n,s,0} * C_{s,n,t} \text{ if } U_{n,t} = 1 \text{ (processor saturated),}$$

where $U_{n,s,0}$ is known from 102 and 108.

The method in one embodiment of the present disclosure can calculate the service time of the stage s of job i on the node. Let this be denoted by $ST_{s,n,i}$. Observe that $$\int_{T_{in,s,i}}^{T_{out,s,i}} U_{n,s,i,t} \, dt = ST_{s,n,i}.$$

The service time is a measure of the amount of processor cycles on node n consumed by job i when in stage s. $ST_{s,n,i}$ is the amount of time stage s of job i spends on node n when the processor is not saturated. Performing this over different jobs in the $\{C_{s,n}\}$ series, a distribution of service times at node n for stage s may be obtained. Let $N_s$ be the set of nodes involved in the execution of stage s. The service time of stage s is a function of the service times of the nodes in $N_s$. The service time depends on how the stage is executed on these nodes. For example, when the stage is executed concurrently on all these nodes, the service time of the stage is equal to the maximum service time of this stage over the nodes in $N_s$. For the case when the stage is executed serially on the nodes, the service time of the stage is equal to the sum of the service times of the nodes in $N_s$. For other graphs of execution of stage over nodes in $N_s$, the service time of the stage can be appropriately defined.

At 112, a predictive modeling may predict bottleneck stages and corresponding physical resources. For example, the system may be modeled as a multiclass closed queuing network with each class representing a logical stage and the throughput/population of each class being the number of active requests in that stage (the concurrency level of that stage). The nodes in the network represent the different physical resources (e.g., CPU/memory/disk) and the service time of each class at a node is estimated using the unit physical resource usage information from 110. This model can then be used for predictive performance analysis of the system and also to identify the physical resources limiting scalability of different logical stages. Queueing network simulation or analytical models may be used to perform predictive performance analysis to identify physical resources limiting scalability of different logical stages.

In one embodiment of the present disclosure, queueing network simulation may be performed at 112 to predict bottleneck stages and corresponding physical resources. In the queueing network simulation, for a given concurrency-level at a resource, we can calculate the aggregate utilization of the resource using the function learned at 108. The aggregate utilization can then be decomposed into resource utilization caused by individual jobs under a given resource scheduling policy. For example, for the weighted sharing policy, one can obtain individual utilization using the approach at 110. For the case when resource is CPU cycles, the individual resource utilization can be used to get the number of processor cycles consumed by the job within unit time interval of the simulation. When the cumulative number of processor cycles consumed by the job becomes equal to the service time of the job on the node (calculated at 110), the job finishes service on the node. Since we have a distribution of service time from 110 for each stage, for each job in that stage in the simulation we can sample a number for the service time from this distribution. In this way one can run a discrete event simulator using the knowledge obtained at 108 and 110. In this queueing network simulation, each job goes through a set of stages (as identified through the job logs) with each stage being executed on one or more nodes in the queueing network, where each node represents a physical resource. For a given concurrency-level vector on a node in the simulation, we obtain the aggregate utilization of the node from 108 and then decompose it to get individual job usage of the node from 110. The amount of time a job stays on a node changes with the utilization level of the node. From the simulation we can estimate the amount of time different stages spend at different nodes, i.e., the response time of a stage at a node, where the node is a physical resource of the system. We can change the load in the simulation by either changing the arrival rates of jobs (in open queueing network simulation) or the number of jobs (in closed queueing network simulation) and study how the response time of different stages of a job changes with the load. The simulation can be done either with single job type (all jobs going through the same set of stages) or mix of different job types. The scaling of response time of different stages on different physical resources (nodes) with the system load can be used to identify the physical resource(s) that will become bottleneck for different stages. This knowledge can be used to scale the physical resources to achieve a desired throughput level.

Figure 4:
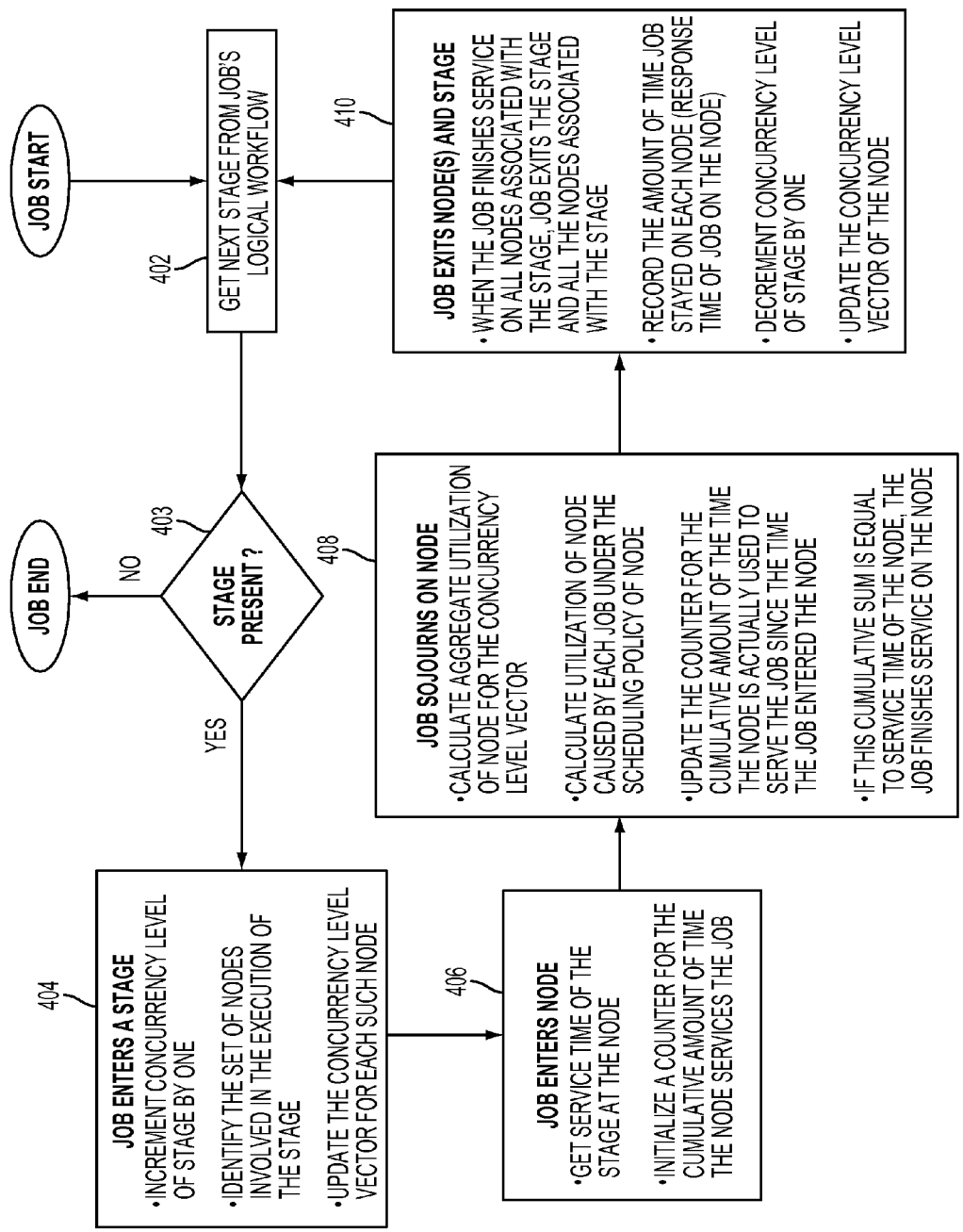
FIG. 4 shows an example algorithm for queueing network simulation in one embodiment of the present disclosure.

FIG. 4 shows an example algorithm for queueing network simulation shown at 112 in FIG. 1. This example illustrates the case with (i) a serial workflow of stages, where a job can be in only one stage at a given time, and (ii) with a job finishing its sojourn in a stage when all the nodes associated with the stage have finished execution of this stage. At 402, next stage from a job's logical workflow is obtained. At 403, it is determined whether there is a stage present to be processed. If no stage is present then the job ends. Otherwise, at 404 the job enters the stage. In this processing block, the concurrency level of the stage is incremented by one. The set of nodes (physical resources) involved in the execution of the stage is identified. The concurrency level vector for each identified node (physical resource) is updated. At 406, the job enters one of the nodes in the simulation setting identified at 404. In this processing, the service time of the stage at the node is obtained, and a counter for the cumulative amount of time the node services the job is initialized. At 408, the job sojourns on the node. In this processing, aggregate utilization of the node for the concurrency level vector is calculated. Utilization of the node caused by each job under the scheduling policy of the node is also calculated. The counter for the cumulative amount of the time the node is actually used to serve the job since the time the job entered the node is updated. If this cumulative sum is equal to service time of the node, the job finishes service on the node. At 410, the job exits the one or more nodes and the stage. When the job finishes service on all the nodes associated with the stage, the job exits the stage and all the nodes associated with the stage. The amount of time the job stayed on each of the nodes (response time of job on the node) is recorded. Concurrency level of stage is decremented by one. The concurrency level vector of the nodes involved in the processing of this job is also updated.

Figure 2:
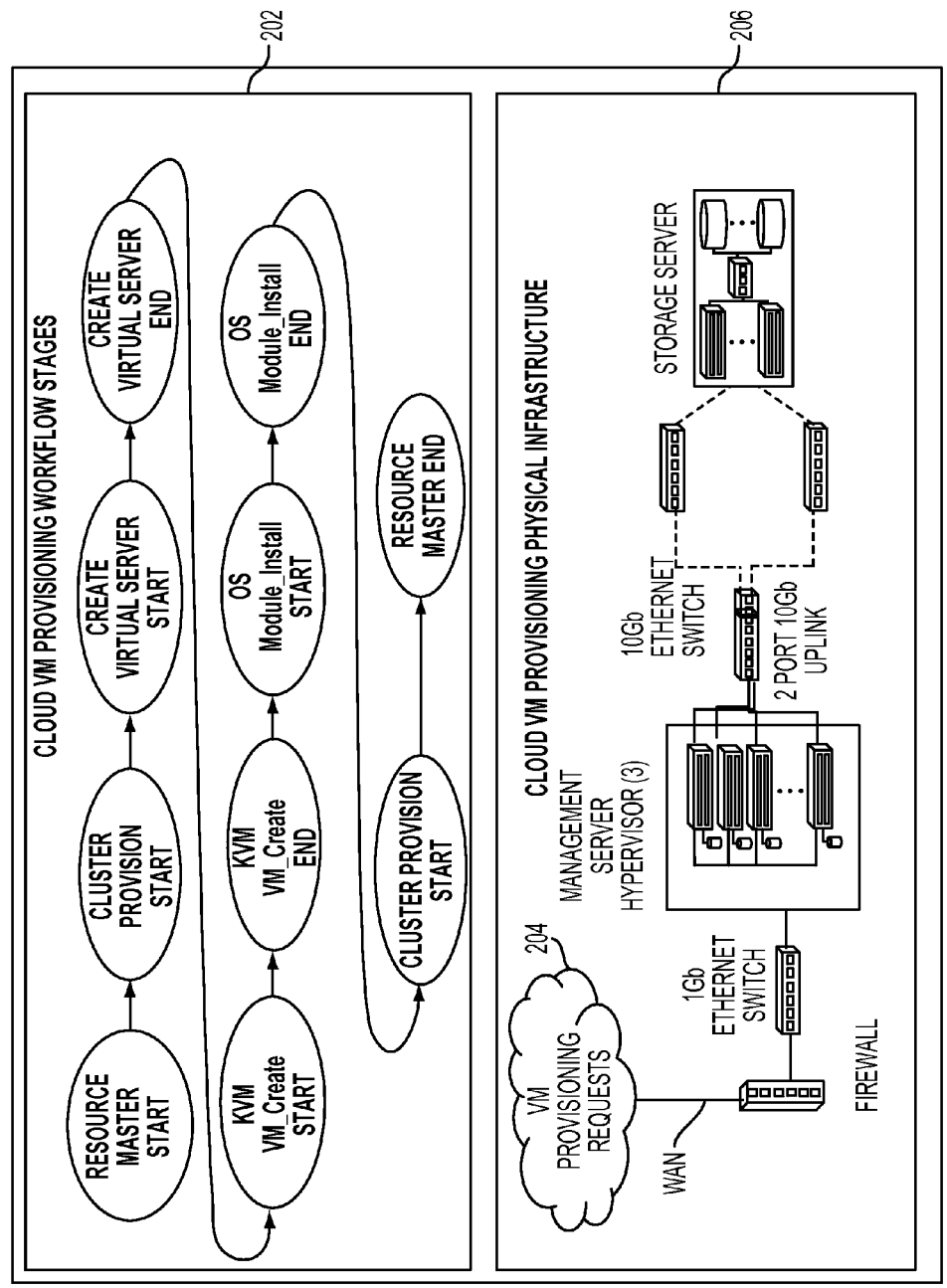
FIG. 2 is a block diagram illustrating workflow stages and system resources in one embodiment of the present disclosure.

FIG. 2 is a block diagram illustrating example workflow stages and system resources in one embodiment of the present disclosure. A distributed system generally has multiple logical stages that may execute sequentially or concurrently, for example, as shown at 202. For example, stream computing may include interconnection of processing elements executing operators, data query, content searching and analytics. Cloud computing, for instance, may include many logical stages in provisioning, including nested stages. For instance, as shown at 202, a virtual machine provisioning workflow stages may comprise Resource Master Start, Cluster Provision Start, Create Virtual Server Start, Create Virtual Server End, KVM VM_Create Start, KVM VM_Create End, OS Module_Install Start, OS Module_Install End, Cluster Provision Start, and Resource Master End. A single stage can execute on one or more physical nodes, for example, concurrently. Multiple logical stages may share physical resources 204. KVM refers to kernel based virtual machine. OS refers to operating system.

Performance evaluation of multi-stage workflows may comprise analyzing scalability and resource bottlenecks, for example, mapping between logical stages (shown at 202) and physical resources (shown at 204), that shows which stage consumes what set of physical resources of the system. The amount of the consumption of different resources by different stages may be determined and how the amount changes with the concurrency level of the stage may be determined. The concurrency level at which a stage will become bottleneck may be determined.

Figure 3:
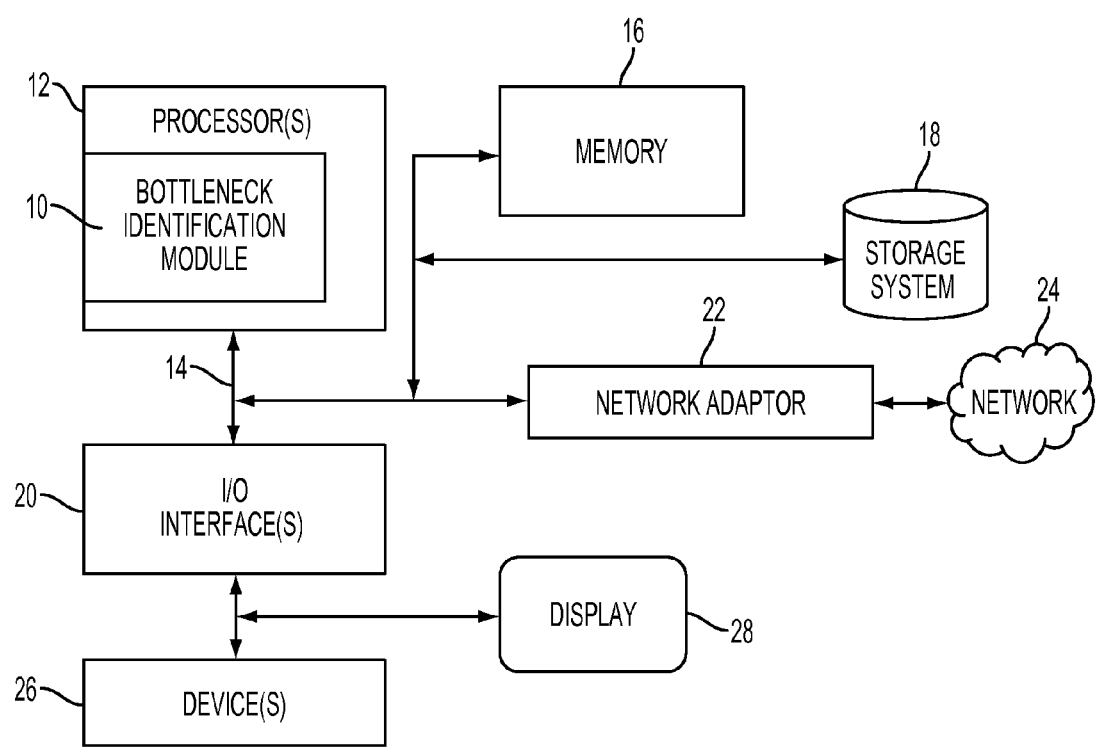
FIG. 3 illustrates a schematic of an example computer or processing system that may implement a bottleneck identification system in one embodiment of the present disclosure.

FIG. 3 illustrates a schematic of an example computer or processing system that may implement a system in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 3 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a bottleneck identification module 10 that performs the methods described herein. The module 10 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages, a scripting language such as Perl, VBS or similar languages, and/or functional languages such as Lisp and ML and logic-oriented languages such as Prolog. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The computer program product may comprise all the respective features enabling the implementation of the methodology described herein, and which—when loaded in a computer system—is able to carry out the methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various aspects of the present disclosure may be embodied as a program, software, or computer instructions embodied in a computer or machine usable or readable medium, which causes the computer or machine to perform the steps of the method when executed on the computer, processor, and/or machine. A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and/or server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

We claim:

1. A method of identifying resource bottleneck in multi-stage workflow processing, comprising:

identifying, by a computer processor, dependencies between logical stages and physical resources in a computing system to determine which logical stage involves what set of the physical resources;

for each of the identified dependencies, determining, by the computer processor, a relationship between a usage level of a physical resource comprising one or more physical nodes and a concurrency level of a logical stage;

estimating, by the computer processor, consumption of the physical resources by each of the logical stages based on the relationship determined for each of the logical stages, the estimating comprising obtaining a distribution of service times for the logical stage over different jobs, a service time measuring amount of processor cycles on physical node n consumed by job i in logical stage s; and performing, by the computer processor, a predictive modeling based on the estimated consumption to determine a bottleneck concurrency level at which said each of the logical stages and corresponding physical resources will become bottleneck, wherein the physical resources are scaled based on the predictive modeling to achieve a desired throughput level, wherein the identifying comprises:

obtaining for each of the logical stages, concurrency levels in said each of the logical stages over a given time;

obtaining utilization levels over the given time for each of the physical resources; and for each of the logical stages, identifying the physical resources having the utilization levels that correlate with a change in the concurrency levels of a logical stages by computing a cross-correlation coefficient between a concurrency level over the given time of a logical stage and a utilization level over the given time of a resource for each of the physical resources, the concurrency level of the logical stage representing a number of jobs that are executing that stage at the given time.

2. The method of claim 1, wherein the determining the relationship comprises analyzing change in the usage level of the physical resource to unit increase or decrease in the concurrency level of the logical stage.

3. The method of claim 1, wherein the determining the relationship comprises using regression function to identify the relationship between utilization of the physical resource and the concurrency level of the logical stage.

4. The method of claim 1, wherein the estimating comprises: estimating service time of the logical stage as a function of service time at different nodes involved in processing the logical stage.

5. The method of claim 4, wherein the service time at different nodes accounts for a scheduling policy of one or more jobs at one or more of the physical resources.

6. The method of claim 1, wherein the performing a predictive modeling comprises performing a queuing network simulation that applies the functional relationship and the consumption of the physical resources by each of the logical stages.

7. A non-transitory computer readable storage device storing a program of instructions executable by a machine to perform a method of identifying resource bottleneck in multi-stage workflow processing, the method comprising:
identifying dependencies between logical stages and physical resources in a computing system to determine which logical stage involves what set of physical resources;
for each of the identified dependencies, determining a relationship between a usage level of a physical resource comprising one or more physical nodes and a concurrency level of a logical stage;
estimating consumption of the physical resources by each of the logical stages based on the relationship determined for each of the logical stages, the estimating comprising obtaining a distribution of service times for the logical stage over different jobs, a service time measuring amount of processor cycles on physical node n consumed by job i in logical stage s; and
performing a predictive modeling based on the estimated consumption to determine a bottleneck concurrency level at which said each of the logical stages and corresponding physical resources will become bottleneck, wherein the physical resources are scaled based on the predictive modeling to achieve a desired throughput level,
wherein the identifying comprises:
obtaining for each of the logical stages, concurrency levels in said each of the logical stages over a given time;
obtaining utilization levels over the given time for each of the physical resources; and
for each of the logical stages, identifying the physical resources having the utilization levels that correlate with a change in the concurrency levels of a logical stage by computing a cross-correlation coefficient between a concurrency level over the given time of a logical stage and a utilization level over the given time of a resource for each of the physical resources,
the concurrency level of the logical stage representing a number of jobs that are executing that stage at the given time.

8. The computer readable storage device of claim 7, wherein the determining the relationship comprises analyzing change in the usage level of the physical resource to unit increase or decrease in the concurrency level of the logical stage.

9. The computer readable storage device of claim 7, wherein the determining the relationship comprises using regression function to identify the relationship between utilization of the physical resource and the concurrency level of the logical stage.

10. The computer readable storage device of claim 7, wherein the performing a predictive modeling comprises performing a queuing network simulation apply the relationship and the consumption of the physical resources by each of the logical stages.

11. A system for identifying resource bottleneck in multi-stage workflow processing, comprising:
a computer processor;
a module executing on the computer processor and further identifies dependencies between logical stages and physical resources in a computing system to determine which logical stage involves what set of physical resources,
for each of the identified dependencies, the module further determines a relationship between a usage level of a physical resource comprising one or more physical nodes and a concurrency level of a logical stage,
the module further estimates a consumption of the physical resources by each of the logical stages based on the relationship determined for each of the logical stages, the module estimating the consumption comprising obtaining a distribution of service times for the logical stage over different jobs, a service time measuring amount of processor cycles on physical node n consumed by job i in logical stage s, and
the module further performs a predictive modeling based on the estimated consumption to determine a bottleneck concurrency level at which said each of the logical stages will become bottleneck and corresponding physical resources, wherein the physical resources are scaled based on the predictive modeling to achieve a desired throughput level,
wherein to identify dependencies between the logical stages and the physical resources, the module is operable to obtain for each of the logical stages, concurrency levels in said each of the logical stages over a given time, the module further obtains utilization levels for each of the physical resources, and for each of the logical stages, the module is further identifies the physical resources having the utilization levels that correlate with a change in the concurrency levels of a logical stages by computing a cross-correlation coefficient between a concurrency level over the given time of a logical stage and a utilization level over the given time of a resource for each of the physical resources,
the concurrency level of the logical stage representing a number of jobs that are executing that stage at the given time.

12. The system of claim 11, wherein, to determine the relationship, the module further analyzes a change in the usage level of the physical resource to unit increase or decrease in the concurrency level of the logical stage.

13. The system of claim 11, wherein to determine the relationship, the module further uses a regression function to identify the relationship between utilization of the physical resource and the concurrency level of the logical stage.

14. The system of claim 11, wherein to estimate the consumption, the module further estimate estimates a service time of the logical stage at different physical nodes involved in processing the logical stage.

15. The system of claim 11, wherein to estimate the consumption, the module further obtains a distribution of service times for the logical stage over different jobs.

* * * * *